United States Patent [19]

Nishibe

[11] Patent Number: 5,592,112
[45] Date of Patent: Jan. 7, 1997

[54] MOTOR CURRENT DETECTION CIRCUIT

[75] Inventor: Yasushi Nishibe, Niwa, Japan

[73] Assignee: Kabushiki Kaisha Tokai-Rika-Denki-Seisakusho, Niwa, Japan

[21] Appl. No.: 601,537

[22] Filed: Feb. 14, 1996

Related U.S. Application Data

[63] Continuation of Ser. No. 195,287, Feb. 14, 1994, abandoned.

[30] Foreign Application Priority Data

Feb. 18, 1993 [JP] Japan ........................ 5-29347

[51] Int. Cl.$^6$ .......................... H03K 5/153; H03K 3/037
[52] U.S. Cl. ................... 327/87; 327/77; 327/89; 327/205
[58] Field of Search ................... 327/50, 51, 52, 327/56, 77, 78, 87, 88, 89, 110, 68, 73, 205, 131, 137, 170, 336, 344

[56] References Cited

U.S. PATENT DOCUMENTS

| | | | |
|---|---|---|---|
| 4,123,792 | 10/1978 | Gephart et al. | 361/30 |
| 4,210,948 | 7/1980 | Waltz | 361/76 |
| 4,354,235 | 10/1982 | Blakeslee | 307/358 |
| 4,528,486 | 7/1985 | Flaig et al. | 318/254 |
| 4,558,310 | 12/1985 | McAllise | 340/661 |
| 4,746,813 | 5/1988 | Disser | 327/379 |
| 5,245,526 | 9/1993 | Balakrishnan et al. | 327/77 |
| 5,424,666 | 6/1995 | Palara et al. | 327/131 |

FOREIGN PATENT DOCUMENTS

| | | |
|---|---|---|
| 63-129878 | 6/1988 | Japan . |
| 1271885 | 4/1972 | United Kingdom . |

Primary Examiner—Toan Tran
Attorney, Agent, or Firm—Oliff & Berridge

[57] ABSTRACT

A motor current detection circuit is formed of a current detector for detecting an overloaded state of a motor by comparing a motor current value, which represents current flowing through the motor, with a predetermined reference value, and a hysteresis generating circuit for generating, in the current detector, a hysteresis characteristic corresponding to an integrated value with respect to time of an increment amount by which the motor current value exceeds the reference value. Chattering in output of the current detector is reduced so that an overloaded state of the motor can be detected quickly.

4 Claims, 5 Drawing Sheets

MOTOR CURRENT DETECTION CIRCUIT

This is a continuation of application Ser. No. 08/195,287 filed Feb. 14, 1994, now abandoned.

BACKGROUND OF THE INVENTION

1. Field of the Invention

The present invention relates to a motor current detection circuit, and particularly to a motor current detection circuit for monitoring current flowing through a motor so as to detect an overloaded state of the motor.

2. Description of the Related Art

In order to monitor current flowing through a motor so as to detect an overloaded state of the motor, a shunt resistor is serially connected between the motor and ground such that an electric potential difference is produced between both ends of the resistor. The electric potential at a point between the motor and the resistor is compared with a reference electric potential Vref by using a comparator so as to detect an overloaded state of the motor based on output from the comparator.

Due to the characteristics of a motor, the motor current fluctuates so as to repeatedly increase and decrease within a certain range depending on the number of the poles and the rotational speed (the range becomes more narrow as the number of poles increases). Accordingly, in a case in which the motor current increases on the whole over time along with the above-mentioned fluctuations as shown in FIG. 5, and the reference electric potential Vref is set to a value corresponding, for example, to an allowable load, the output Oc of the comparator repeatedly fluctuates between a high level state (hereinafter referred to as "Hi") and a low level state (hereinafter referred to as "Lo"), as shown in FIG. 5. Due to this fluctuation, chattering which corresponds to the fluctuation in the current occurs in the output Oc, i.e., the detection output. Since the motor current repeatedly increases and decreases within a certain range as mentioned above, a drawback arises in that setting of the reference electric potential Vref for preventing the occurrence of chattering is difficult. Although addition of a so-called chattering prevention circuit in which the motor current is detected after fluctuation of the motor current abates is considered as a possible solution, the addition of the chattering prevention circuit causes the drawback of producing delays in the detecting operation.

SUMMARY OF THE INVENTION

The present invention has been accomplished in view of the foregoing, and the object of the present invention is to provide an improved motor current detection circuit which is capable of effectively reducing chattering in detection output caused by fluctuation of motor current so as to quickly detect an overloaded state of the motor.

The present invention is a motor current detection circuit which includes a current detector for detecting an overloaded state of a motor by comparing a motor current value, which represents current flowing through the motor, with a predetermined reference value, and a hysteresis generating circuit for generating, in the current detector, a hysteresis characteristic corresponding to an integrated value with respect to time (hereinafter referred to as time-integrated value) of the increment amount by which the motor current value exceeds the reference value.

In accordance with the above-described structure, the hysteresis generating circuit generates in the current detector a hysteresis characteristic whose amount of hysteresis increases over time in accordance with the time-integrated value of the increment amount by which the motor current value exceeds the reference value in a case in which the motor current increases on the whole while fluctuating so as to repeatedly increase and decrease within a certain range (and in a predetermined cycle) depending on the number of poles and the rotational speed of the motor. Accordingly, in a case in which the time constant of the hysteresis generating circuit is set to be greater than the period (the length of the increasing and decreasing changes) of the motor current, the final magnitude of the hysteresis is set to be large. Due to this hysteresis, chattering in the output of the current detector, i.e., the detection output, is reduced so that an overloaded state of the motor can be detected quickly. On the other hand, in a case in which the motor current includes noise of frequencies higher than that of the motor current, the magnitude of the hysteresis is set to be small because the time-integrated value is small. Therefore, it is difficult for erroneous detection due noise to occur.

Further, by properly setting the time constant of the hysteresis generating circuit, it is possible to prevent chattering in the detection output when and after the motor current value exceeds the reference value. In this case, an overloaded state of the motor can be detected even more quickly.

In accordance with the present invention, in a case in which the motor current increases on the whole while fluctuating so as to repeatedly increase and decrease within a certain range (and in a predetermined cycle) according to the number of the poles and the rotational speed of the motor, the hysteresis generating circuit generates in the current detector a hysteresis characteristic whose magnitude increases over time in accordance with a time-integrated value of the increment amount by which the motor current value exceeds the reference value. Accordingly, by properly setting the time constant of the hysteresis generating circuit, it becomes possible to finally make the magnitude of the hysteresis large without causing erroneous detection due to high frequency noises. Accordingly, the present invention provides benefits which cannot be obtained from the prior art, i.e., reduction of chattering in detection output and quicker detection of an overloaded state of a motor.

BRIEF DESCRIPTION OF THE ACCOMPANYING DRAWINGS

DETAILED DESCRIPTION OF THE PREFERRED EMBODIMENTS

An embodiment of the present invention will now be described with reference to FIG. 1 through FIG. 3.

Figure 1:
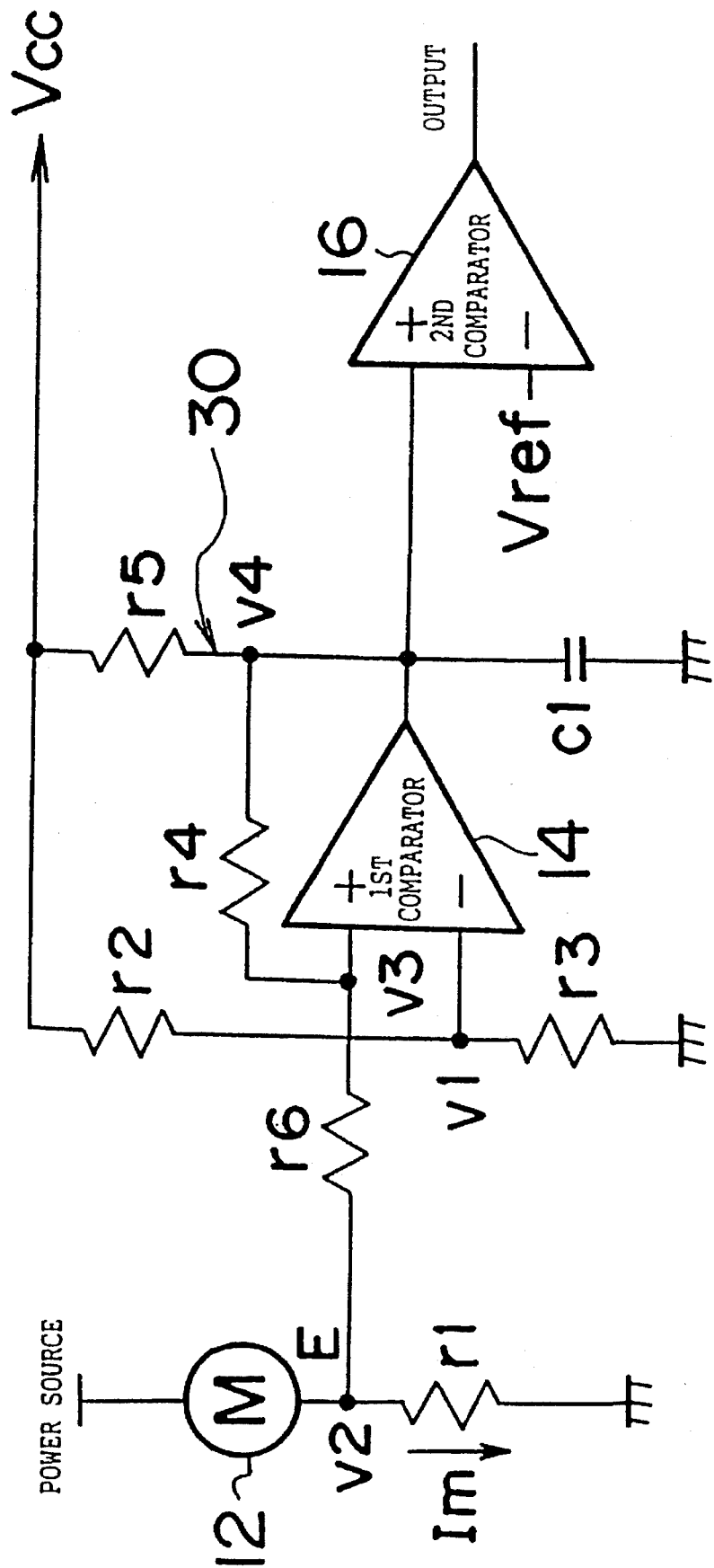
FIG. 1 is a circuit diagram showing a structure of an embodiment of the present invention.

FIG. 1 shows a circuit diagram of a motor current detection circuit 10 according to the present embodiment. As shown in FIG. 1, one terminal of a motor 12 is connected to a power source, and one end of a shunt resistor r1 (having a very small resistance) is connected to the other terminal of the motor 12. The other end of the shunt resistor r1 is grounded. Accordingly, when motor current Im flows through the shunt resistor r1, an electric potential difference is produced between both ends of the shunt resistor r1 so that the motor current Im can be detected as an electric potential v2 at point E shown in FIG. 1.

Point E is connected via a resistor r6 to a non-inverted input terminal of an open-collector type comparator 14 acting as a current detector. The comparator 14 compares an electric potential v3 at the non-inverted input terminal which represents the detected value of the motor current with an electric potential v1 at the inverted input terminal which represents a reference value. The comparator 14 outputs Hi or Lo depending on the result of comparison.

A load resistor r5 is connected between a circuit power source Vcc and the output terminal of the comparator 14, while a feedback resistor r4 is connected between the output terminal and the non-inverted input terminal of the comparator 14. Further, a capacitor c1 is connected between the output terminal of the comparator 14 and ground. In the present embodiment, the load resistor r5 and the capacitor c1 form an integration circuit having a time constant $c_1 \cdot r_5$.

The inverted input terminal of the comparator 14 is supplied with a constant preset voltage (reference value) v1 which is obtained by dividing a circuit power source voltage Vcc at the resistors r2 and r3. The voltage v3 at the non-inverted input terminal of the comparator 14 is determined by the resistors r4, r5 and r6, the voltage v2, the electric potential (Hi or Lo) at the output terminal of the comparator 14, and the amount of charge in the capacitor c1.

In the present embodiment, an integration circuit comprised of the load resistor r5 and the capacitor c1, and the feedback resistor r4 form a hysteresis generating circuit 30 which generates, in the comparator 14, a hysteresis characteristic corresponding to the time-integrated value of the increment amount by which the electric potential v2 (corresponding to the motor current Im) at point E exceeds the above-mentioned reference value.

The output from the comparator 14 is input to the non-inverted input terminal of another comparator 16, and is compared with a reference electric potential Vref which is input to the inverted input terminal of the comparator 16 so that the output from the comparator 14 is subjected to waveform shaping.

Next, the operation of a main part of the embodiment having the above-described structure will be explained.

As previously described, the reference value v1, which is the electric potential at the inverted input terminal, and the electric potential v3 (representing the motor current), which is the electric potential at the non-inverted input terminal, are compared with each other by the comparator 14. Here, the electric potential v3 representing the motor current is an electric potential at the junction between the resistors r4 and r6, at which the electric potential difference |v4−v2| of the electric potential v2 (corresponding to motor current Im) at point E and the electric potential v4 at the output terminal of the comparator 14 is divided. The electric potential v3 is therefore expressed by following equation (1):

$$v3 = (v4 \cdot r6 + v2 \cdot r4)/(r4 + r6) \quad (1)$$

As is apparent from equation (1), v3 is a function of v2, and therefore, v3 changes in accordance with v2.

When v3<v1, the output of the comparator 14 becomes Lo, and v4 becomes almost zero volts. In this case, the electric potential v3 is expressed by following equation (2):

$$v3 = v2 \cdot r4/(r4 + r6) \quad (2)$$

When the motor current Im increases and v2 increases accordingly, as is apparent from equation (2), v3 also increases so that the inequality v3>v1 is satisfied soon, and the output of the comparator 14 changes from Lo to Hi. Accordingly, the capacitor c1 is gradually charged by current which is supplied from the circuit power source Vcc via the resistor r5. As a result, the electric potential v4 increases, and further, v3 increases even more, as is apparent from equation (1).

Figure 2:
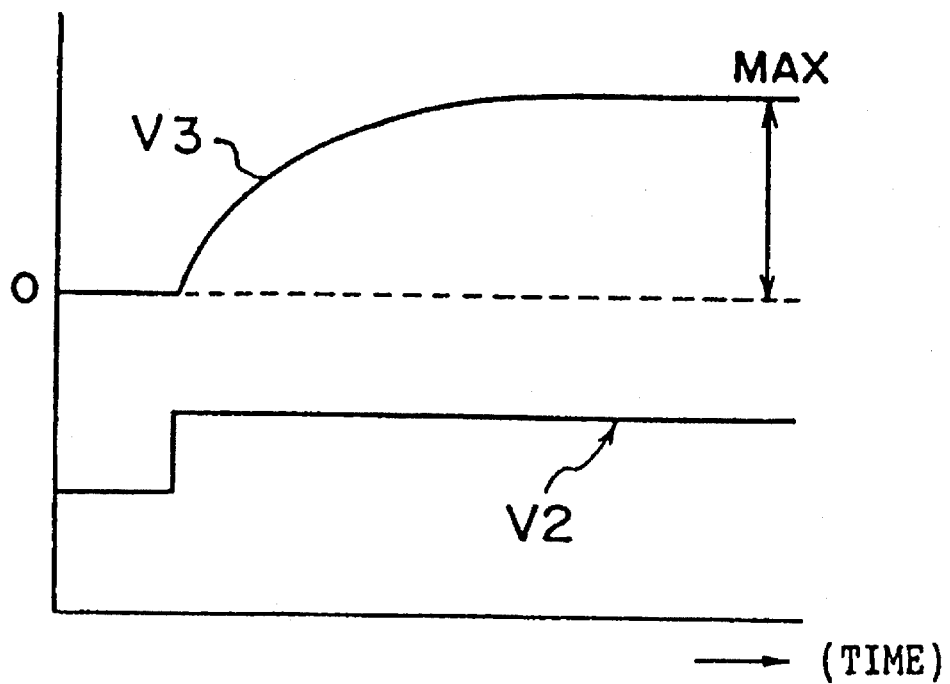
FIG. 2 is a graph for explaining operation of a main part of the embodiment shown in FIG. 1.

FIG. 2 shows variations in the electric potential v3 in a case in which the electric potential v2 at point E corresponding to the motor current varies as illustrated in the drawing. The amount of variation over time in the electric potential v3, which is shown in FIG. 2, is determined by the hysteresis generating circuit 30, namely, the time constant $c_1 \cdot r_5$ of the previously mentioned integration circuit, and the maximum value MAX thereof is determined by the resistances of the resistors r4 and r6.

Next, referring to FIG. 3, an explanation will be given of operation of the current detection circuit 10 for detecting an overloaded state of the motor 12, whose current gradually increases while repeatedly increasing and decreasing over a predetermined period.

Figure 3:
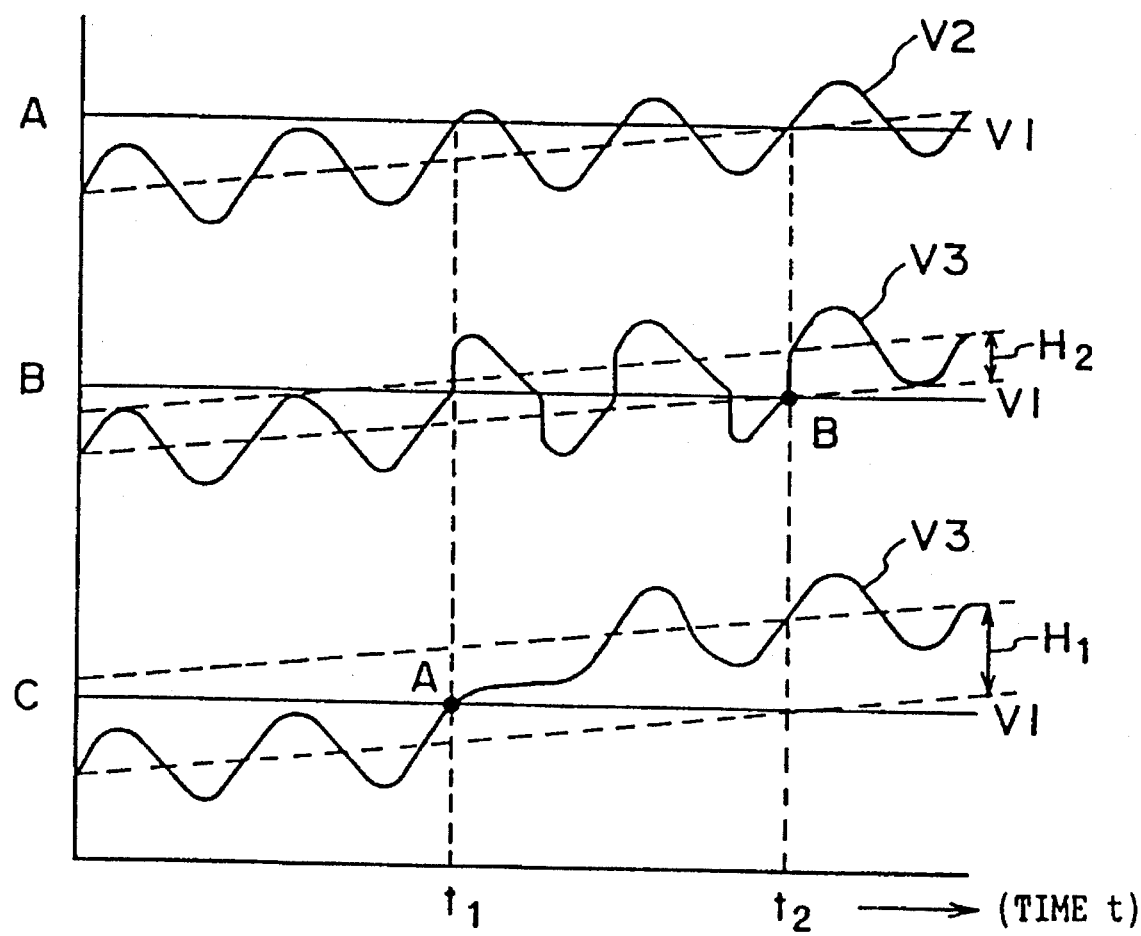
FIG. 3 is a graph for explaining operation of the embodiment shown in FIG. 1 when an overloaded state of a motor is detected.

When the motor current Im gradually increases while repeatedly increasing and decreasing within a certain range which depends on the characteristics, the number of poles and the rotational speed of the motor 12, the electric potential v2 at point E varies accordingly, as shown in section A of FIG. 3.

After a lapse of time of $t_1$ from the beginning of detection, v3 reaches the reference electric potential v1 due to the increase of the electric potential v2 at point E, so that the output of the comparator 14 changes from Lo to Hi. Accordingly, the capacitor c1 is gradually charged by current which is supplied from the circuit power source Vcc via the resistor r5. As a result, the electric potential v3 thereafter varies in accordance with the increasing and decreasing changes of the electric potential v2 and the amount of charge in the capacitor c1. Specifically, after the lapse of time $t_1$, the comparator 14 has a hysteresis characteristic such that its hysteresis increases over time in accordance with the time-integrated value of the increment amount by which the electric potential v2 (corresponding to motor current Im) at point E exceeds the preset voltage (reference value) v1. As a result, the electric potential v3 can be made to vary in accordance with the circuit constants of the respective circuit elements (the method of determining the circuit constants will be described hereinafter by way of an example), after the point in time A in section C of FIG. 3. In this case, the output of the comparator 14 is maintained Hi after the point in time A. When the electric potential v4 becomes greater than the reference electric potential Vref after a predetermined period of time has elapsed from the point in time A, the output of the comparator 16 changes from Lo to Hi, so that a detection signal (high level signal) indicating an overloaded state of the motor 12 is output from the comparator 16.

In section C of FIG. 3, $H_1$ indicates the final amount of the hysteresis. As is apparent from previously mentioned equations (1) and (2), the final amount $H_1$ of the hysteresis is expressed as follows:

$$H_1 = v4 \cdot r6/(r4 + r6).$$

Section B of FIG. 3 shows variations of the electric potential v3 in a case in which the capacitor c1 is removed from the circuit shown in FIG. 1. In this case, although the output of the comparator 14 is maintained Hi after the point in time B at which a period of time $t_2$ has elapsed from the beginning of detection, the output of the comparator 14 repeatedly changes from Lo to Hi to Lo before the point in time B. In this case, the output of the comparator 16 changes from Lo to Hi when the electric potential v4 becomes greater than the reference electric potential Vref after the above-mentioned predetermined period of time has passed from the point in time B, so that a detection signal (high level signal) indicating an overloaded state of the motor 12 is output from the comparator 16.

As can be clearly understood by comparing sections B and C of FIG. 3, the motor current detection circuit 10 shown in FIG. 1 can detect an overloaded state of the motor 12 more quickly than the case in which chattering in the detection output is prevented by generating a hysteresis characteristic in the comparator 14 by using positive feedback only (corresponding to the case shown in section B of FIG. 3).

Further, as can be clearly understood by comparing the hysteresis amounts $H_1$ and $H_2$, the final magnitude of the hysteresis can be made larger in the present embodiment. Further, when considering noise having frequencies higher than the frequency of the motor current Im, the time-integrated value of the increment amount by which the electric potential v2 (corresponding to motor current Im) at point E exceeds the preset voltage (reference value) v1 becomes small, so that the comparator 14 is made to have a small hysteresis. Therefore, erroneous detection caused by noise is less likely to occur, and the detection circuit has an improved resistance to noise.

Assuming that sinusoidal variation occurs in the motor current Im at a frequency of 50 Hz with the maximum and minimum amplitudes with respect to the mean value being ±1A, and that the circuit shown in FIG. 1 has circuit constants r1=10 mΩ, r4=200 kΩ, r5=6.2 KΩ, r6=1 KΩ, c1=1 µF, and Vcc 5 V, electric potentials at various portions of the circuit shown in FIG. 1 change as follows.

The electric potential v2 is expressed as follows:

$$v2 = 10 \times 10^{-3} \cdot \{Im + \cos(f)\} \quad (3)$$
$$= 10^{-2} \cdot \{Im + \cos(f)\},$$

and the variation amount thereof is expressed as follows:

$$dv2 = 10^{-3} \cos(f) \quad (4)$$

When v3≦v1, the output of the comparator 14 is Lo and the electric potential v3 becomes equal to v2.

On the other hand, when v3>v1, the amount of variation of the electric potential v4 is expressed as follows:

$$dv4 = Vcc \cdot \{1 - e^{-(t/c1/r5)}\}. \quad (5)$$

By substituting the above values into equation (1), the amount of variation of the electric potential v3 is obtained as follows:

$$dv3 = 1/201 \cdot dv4 + 200/201 \cdot dv2 \quad (6)$$
$$\approx 1/201 \cdot dv4 + dv2.$$

By substituting equations (4) and (5) into above equation (6), the amount of variation of the electric potential v3 which is effected by the fluctuation of the motor current and the operation of the hysteresis generating circuit is expressed as follows:

$$dv3 = Vcc \cdot \{1 - e^{-(t/c1/r5)}\}/201 + 10^{-2} \cdot \cos(f). \quad (7)$$

Figure 4:
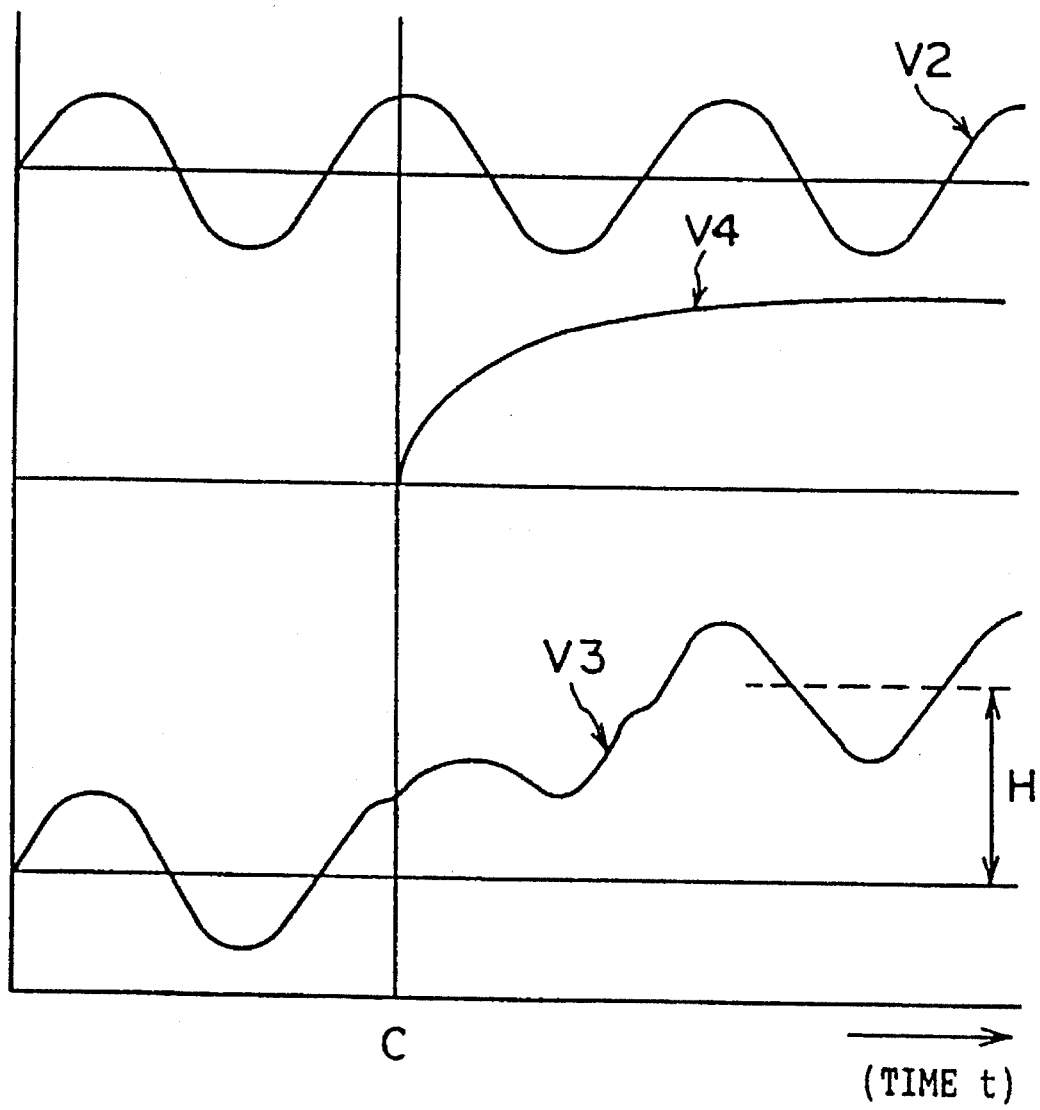
FIG. 4 is a graph showing an example of changes in electric potentials in various portions of the embodiment shown in FIG. 1 in a case in which motor current changes sinusoidally.
Figure 5:
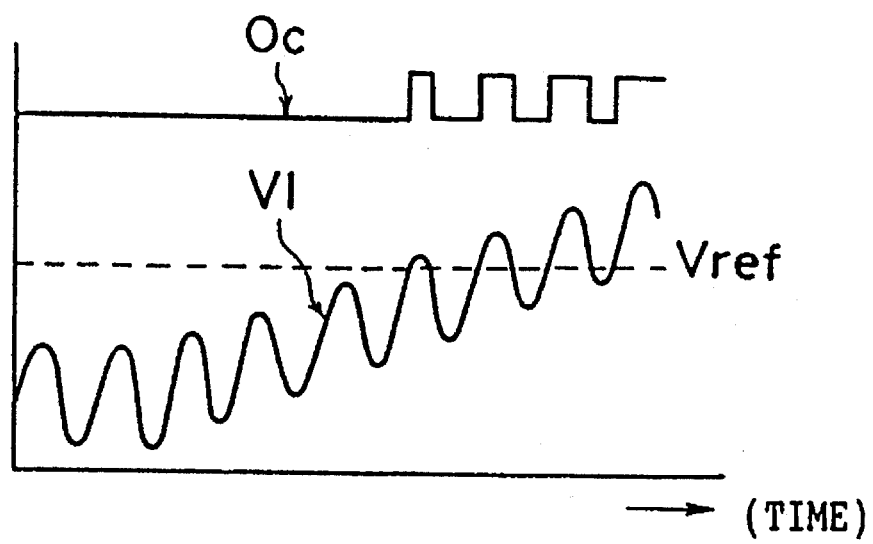
FIG. 5 is a graph for explaining the problem to be solved by the present invention.

FIG. 4 shows variations over time in the electric potentials at various portions in this case. In this drawing, C indicates a detection point, and H indicates the final magnitude of the hysteresis.

What is claimed is:

1. A motor current detection circuit comprising:

a current detector for detecting an overloaded state of a motor by separately receiving a first signal having a value representative of current flowing through said motor and a second signal having a predetermined reference value, said current detector comparing said first signal with said second signal; and a hysteresis generating circuit for generating and applying, in said current detector, a hysteresis characteristic to said first signal, said hysteresis characteristic corresponding to an integrated value with respect to time of an increment amount by which said value representative of the current flowing through said motor exceeds said predetermined reference value, said current detector outputting a third signal representative of the overloaded state of the motor when the value representative of the current flowing through the motor exceeds the predetermined reference value.

2. A motor current detection circuit according to claim 1, wherein said current detector is a comparator having an inverted input terminal and a non-inverted input terminal, the hysteresis characteristic generated by said hysteresis generating circuit varying an electric potential input at said non-inverted input terminal.

3. A motor current detection circuit according to claim 1, wherein said current detector has two input terminals and an output terminal, said hysteresis generating circuit comprising a feedback resistor and an integration circuit, the feedback resistor interposed between said output terminal and a non-inverting input terminal of said current detector, the integration circuit varying electric potentials at both ends of said feedback resistor depending on whether said current detector is in an on state or an off state.

4. A motor current detection circuit according to claim 3, wherein said integration circuit comprises a resistor and a capacitor, the resistor having an end connected to a power source and interposed between said power source and said output terminal of said current detector, the capacitor interposed between said output terminal of said current detector and ground.

* * * * *